(12) United States Patent  
Kathirgamanathan et al.

(10) Patent No.: US 8,012,604 B2
(45) Date of Patent: Sep. 6, 2011

(54) ELECTROLUMINESCENT MATERIALS AND DEVICES

(75) Inventors: Poopathy Kathirgamanathan, North Harrow (GB); Subramaniam Ganeshamurugan, London (GB); Gnanamoly Paramaswara, London (GB); Muthulingham Kumaraverl, Ealing (GB); Arumugam Partheepan, Ilford (GB); Selvadurai Selvaranjan, Raynes Park (GB); Juan Antipan-Lara, London (GB); Richard Price, Chorlton-cum-hardy (GB); Sivagnanasundram Surendrakumar, Middlesex (GB)

(73) Assignee: Merck Patent GmbH, Darmstadt (DE)

( * ) Notice: Subject to any disclaimer, the term of this patent is extended or adjusted under 35 U.S.C. 154(b) by 1035 days.

(21) Appl. No.: 10/589,183

(22) PCT Filed: Feb. 10, 2005

(86) PCT No.: PCT/GB2005/000446
§ 371 (c)(1), (2), (4) Date: Aug. 8, 2007

(87) PCT Pub. No.: WO2005/080526
PCT Pub. Date: Sep. 1, 2005

(65) Prior Publication Data
US 2009/0009060 A1   Jan. 8, 2009

(30) Foreign Application Priority Data
Feb. 14, 2004 (GB) .................... 0403322.1

(51) Int. Cl.
*H01L 51/54* (2006.01)
*C09K 11/06* (2006.01)

(52) U.S. Cl. ........ 428/690; 428/917; 313/504; 313/506; 257/E51.044; 546/4; 548/105; 548/106; 549/3

(58) Field of Classification Search .................. None
See application file for complete search history.

(56) References Cited

U.S. PATENT DOCUMENTS

| 2001/0019782 | A1  | 9/2001  | Igarashi et al. |
| 2002/0024293 | A1* | 2/2002  | Igarashi et al. ............... 313/483 |
| 2002/0034656 | A1* | 3/2002  | Thompson et al. ........... 428/690 |
| 2002/0134984 | A1* | 9/2002  | Igarashi .......................... 257/79 |
| 2002/0182441 | A1* | 12/2002 | Lamansky et al. ............ 428/690 |
| 2002/0190250 | A1  | 12/2002 | Grushin et al. |
| 2003/0059646 | A1* | 3/2003  | Kamatani et al. ............. 428/690 |
| 2004/0091738 | A1* | 5/2004  | Psai et al. ..................... 428/690 |

FOREIGN PATENT DOCUMENTS

| JP | 2003192691 | 7/2003 |
| JP | 2003243175 | 8/2003 |
| WO | WO 2004/008554 A2 * | 1/2004 |

* cited by examiner

*Primary Examiner* — Marie R. Yamnitzky
(74) *Attorney, Agent, or Firm* — David Silverstein; Andover-IP-Law

(57) ABSTRACT

The present invention relates to heteroleptic electroluminescent metal complexes and to their preparation and use in electroluminescent devices, particularly to electroluminescent compounds having the general chemical formula:

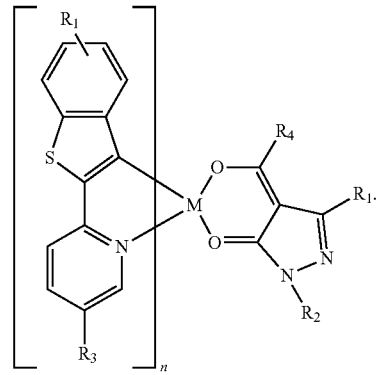

20 Claims, 10 Drawing Sheets

Alq

Bebq

BAlq1

ZnPBO

ZnPBT

DTVbi

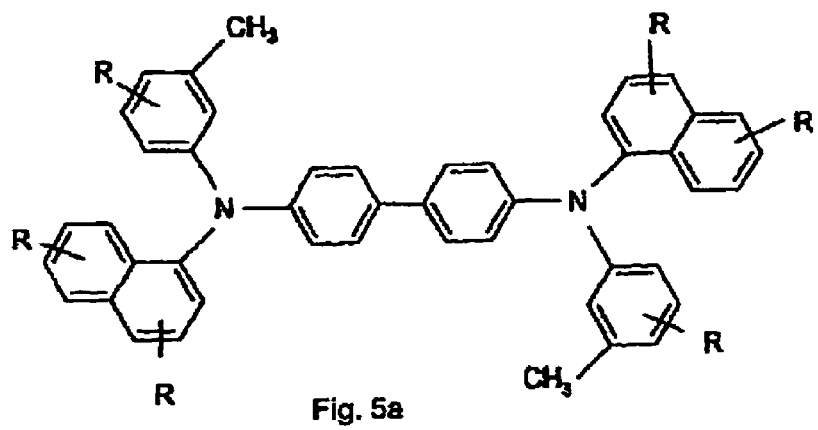
Fig. 5a
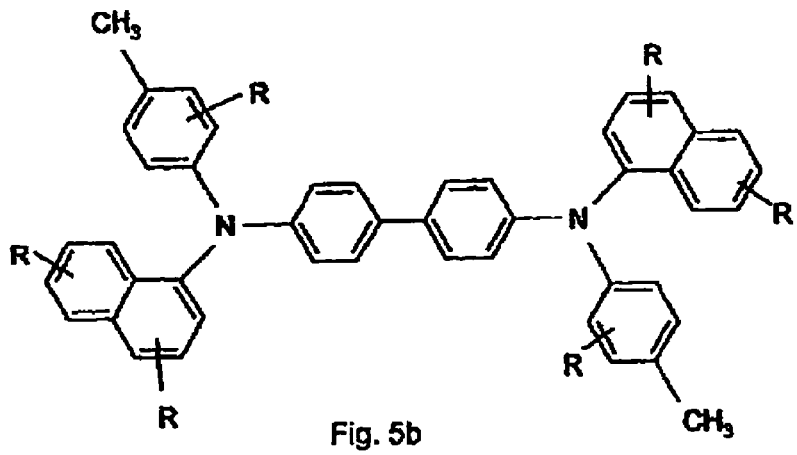
Fig. 5b
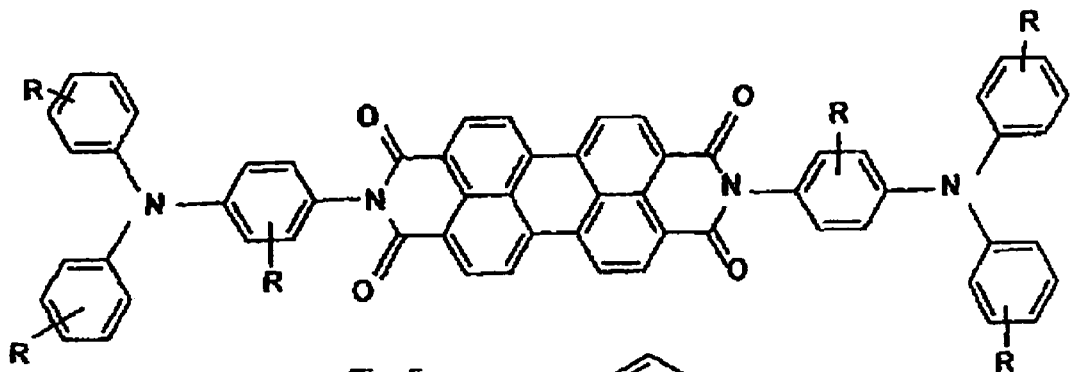
Fig. 5c
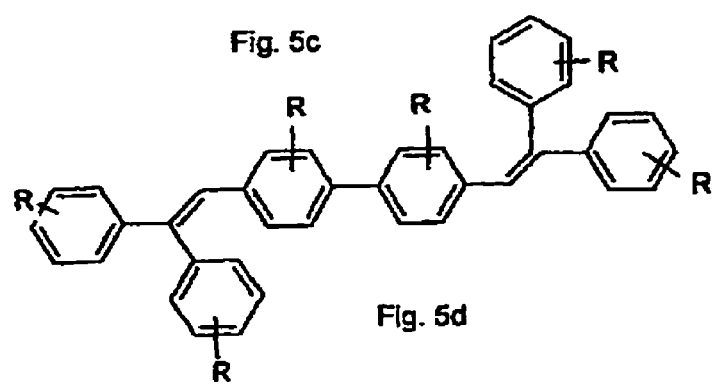
Fig. 5d
Fig. 5 or

α-NPB

TPD mTADATA

ITO (165 nm)/CuPc (25 nm)/α-NPB (40 nm)/CBP : Compound E (35 : 5 nm/Zrq$_4$ (30 nm)/LiF (0.5 nm)/Al ITO (165 nm)/CuPc (25 nm)/ α-NPB (40 nm)/CBP : Compound E (35 : 5 nm/Zrq$_4$ (30 nm)/LiF (0.5 nm)/Al

ELECTROLUMINESCENT MATERIALS AND DEVICES

CROSS-REFERENCE TO RELATED APPLICATIONS

This application is a national stage application of international application PCT/GB2005/000446, filed Feb. 10, 2005, which claims the benefit of the filing date of United Kingdom application no. 0403322.1 filed Feb. 14, 2004.

The present invention relates to electroluminescent materials and to electroluminescent devices.

Materials which emit light when an electric current is passed through them are well known and used in a wide range of display applications. Liquid crystal devices and devices which are based on inorganic semiconductor systems are widely used; however these suffer from the disadvantages of high energy consumption, high cost of manufacture, low quantum efficiency and the inability to make flat panel displays.

Organic polymers have been proposed as useful in electroluminescent devices, but it is not possible to obtain pure colours; they are expensive to make and have a relatively low efficiency.

Another compound which has been proposed is aluminium quinolate, but this requires dopants to be used to obtain a range of colours and has a relatively low efficiency.

Patent application WO98/58037 describes a range of transition metal and lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

U.S. Pat. No. 5,128,587 discloses an electroluminescent device which consists of an organometallic complex of rare earth elements of the lanthanide series sandwiched between a transparent electrode of high work function and a second electrode of low work function with a hole conducting layer interposed between the electroluminescent layer and the transparent high work function electrode and an electron conducting layer interposed between the electroluminescent layer and the electron injecting low work function anode. The hole conducting layer and the electron conducting layer are required to improve the working and the efficiency of the device. The hole transporting layer serves to transport holes and to block the electrons, thus preventing electrons from moving into the electrode without recombining with holes. The recombination of carriers therefore mainly takes place in the emitter layer.

US Patent Application 2003/0194580 discloses electroluminescent iridium complexes.

BRIEF DESCRIPTION OF THE DRAWINGS

In the accompanying drawings:

FIGS. 4, 5, 6, 7 and 8 illustrate chemical formulae of certain types of hole transporting materials that may be used in some invention embodiments.

DETAILED DESCRIPTION OF THE INVENTION

Figure 1:
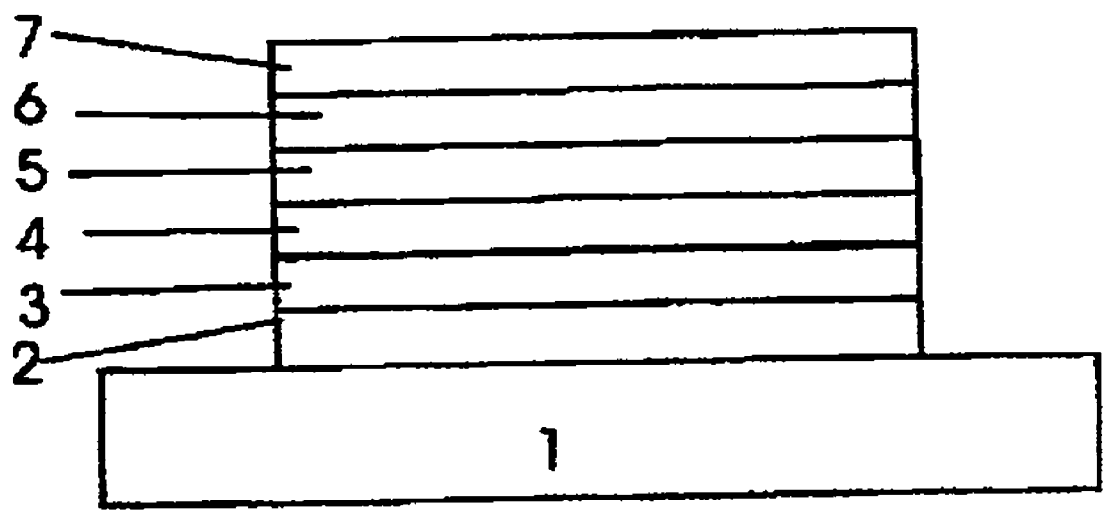
FIG. 1 is a representative electroluminescent device structure fabricated in accordance with this invention as described in Example 1.

We have now discovered different electroluminescent iridium organic complexes.

According to the invention there is provided electroluminescent compounds of formula

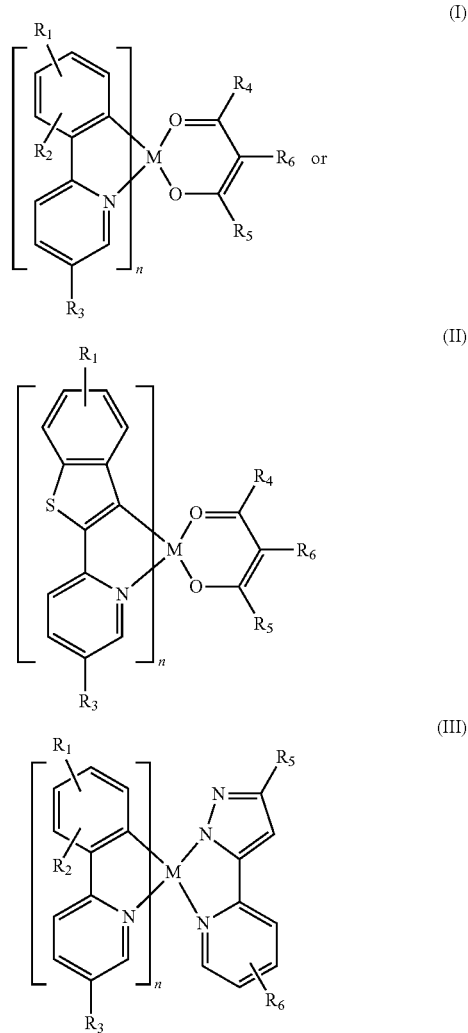

where $R_1$, $R_2$, $R_3$, $R_4$, $R_5$ and $R_6$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$, and $R_3$ can also form substituted and unsubstituted fused aromatic, heterocyclic and polycyclic ring structures and can be copolymerisable with a monomer, e.g. styrene, and where $R_4$ and $R_5$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer, e.g. styrene, M is ruthenium, rhodium, palladium, osmium, iridium or platinum and n+1 is the valency of M; preferably M is iridium and n is 2.

The invention also provides a method of preparing a compound of formula

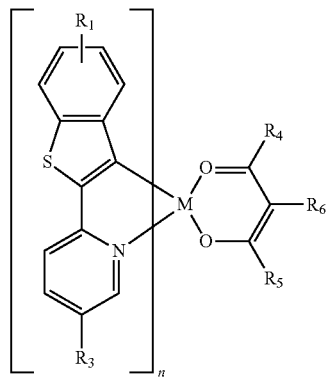

which comprises reacting a compound of formula

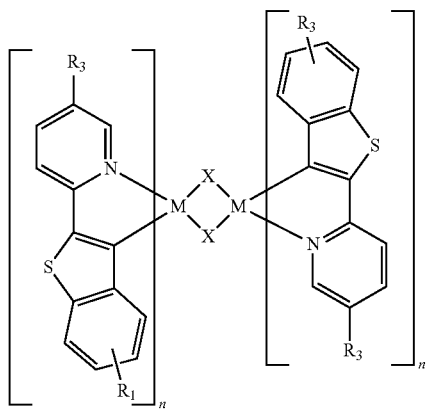

with a compound of formula

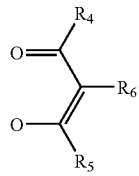

where $R_1$, $R_2$, $R_3$, $R_4$, $R_5$ and $R_6$ are as above, X is an anion and n+1 is the valency of M.

Some of the dimetal complexes used to form the compounds of the present invention are known compounds; for example Tetrakis(2-phenylpyridine-$C^2$,N')(µ-chloro) diiridium (Watts et al., J. Am. Chem. Soc., 1985, 107, 1431.)

Examples of $R_1$ and/or $R_2$ and/or $R_3$ and/or $R_4$ and/or $R_5$ and/or $R_6$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

Preferred compounds (I) are those in which $R_5$ and $R_6$ form a

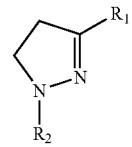

group e.g.

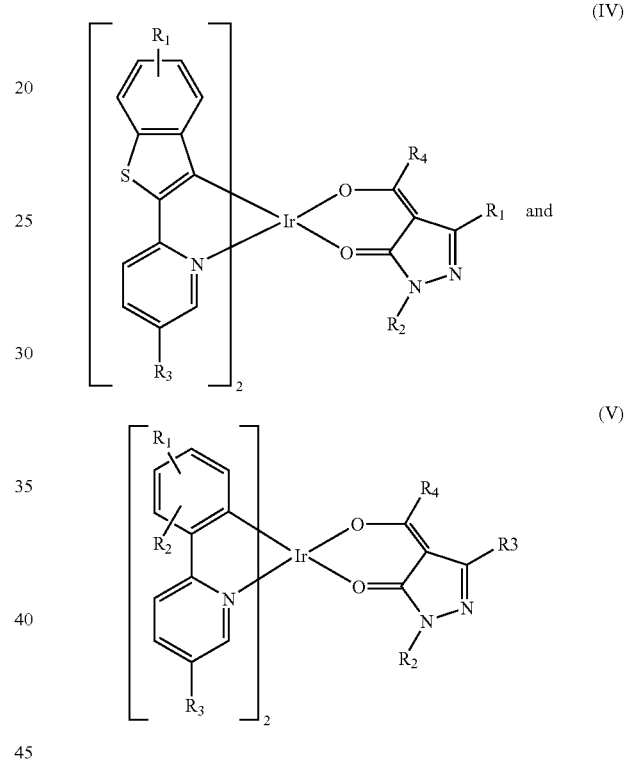

preferably $R_2$ is a phenyl or substituted phenyl group.

The invention also provides an electroluminescent device which comprises (i) a first electrode (ii) a layer of an electroluminescent material of formula (I) or (II) above and (iii) a second electrode.

The first electrode can function as the anode and the second electrode can function as the cathode and preferably there is a layer of a hole transporting material between the anode and the layer of the electroluminescent compound.

The hole transporting material can be any of the hole transporting materials used in electroluminescent devices.

The hole transporting material can be an amine complex such as poly (vinylcarbazole), N,N'-diphenyl-N,N'-bis(3-methylphenyl)-1,1'-biphenyl-4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

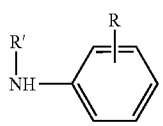
(VI)

where R is in the ortho- or meta-position and is hydrogen, C1-18 alkyl, C1-6 alkoxy, amino, chloro, bromo, hydroxy or the group

where R is alky or aryl and R' is hydrogen, C1-6 alkyl or aryl with at least one other monomer of formula I above.

Or the hole transporting material can be a polyaniline; polyanilines which can be used in the present invention have the general formula

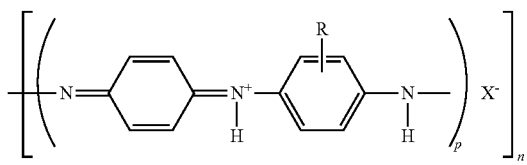
(VII)

where p is from 1 to 10 and n is from 1 to 20, R is as defined above and X is an anion, preferably selected from Cl, Br, $SO_4$, $BF_4$, $PF_6$, $H_2PO_3$, $H_2PO_4$, arylsulphonate, arenedicarboxylate, polystyrenesulphonate, polyacrylate alkysulphonate, vinylsulphonate, vinylbenzene sulphonate, cellulose sulphonate, camphor sulphonates, cellulose sulphate or a perfluorinated polyanion.

Examples of arylsulphonates are p-toluenesulphonate, benzenesulphonate, 9,10-anthraquinone-sulphonate and anthracenesulphonate; an example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated. However we have surprisingly found that if the unsubstituted or substituted polymer of an amino substituted aromatic compound is deprotonated, then it can be easily evaporated, i.e. the polymer is evaporable.

Preferably evaporable deprotonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. MacDiamid and A. F. Epstein, Faraday Discussions, Chem Soc. 88 P319 1989.

The conductivity of the polyaniline is dependent on the degree of protonation with the maximum conductivity being when the degree of protonation is between 40 and 60%, for example, about 50%.

Preferably the polymer is substantially fully deprotonated.

A polyaniline can be formed of octamer units. i.e. p is four, e.g.

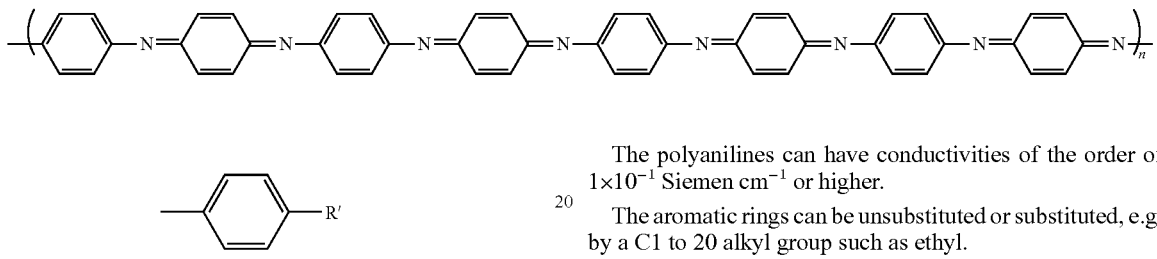

The polyanilines can have conductivities of the order of $1 \times 10^{-1}$ Siemen $cm^{-1}$ or higher.

The aromatic rings can be unsubstituted or substituted, e.g. by a C1 to 20 alkyl group such as ethyl.

The polyaniline can be a copolymer of aniline and preferred copolymers are the copolymers of aniline with o-anisidine, m-sulphanilic acid or o-aminophenol, or o-toluidine with o-aminophenol, o-ethylaniline, o-phenylene diamine or with amino anthracenes.

Other polymers of an amino substituted aromatic compound which can be used include substituted or unsubstituted polyaminonapthalenes, polyaminoanthracenes, polyaminophenanthrenes, etc. and polymers of any other condensed polyaromatic compound. Polyaminoanthracenes and methods of making them are disclosed in U.S. Pat. No. 6,153,726. The aromatic rings can be unsubstituted or substituted, e.g. by a group R as defined above.

Other hole transporting materials are conjugated polymer and the conjugated polymers which can be used can be any of the conjugated polymers disclosed or referred to in U.S. Pat. No. 5,807,627, PCT/WO90/13148 and PCT/WO92/03490.

The preferred conjugated polymers are poly(p-phenylenevinylene)-PPV and copolymers including PPV. Other preferred polymers are poly(2,5 dialkoxyphenylene vinylene) such as poly(2-methoxy-5-(2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group, poly fluorenes and oligofluorenes, polyphenylenes and oligophenylenes, polyanthracenes and oligo anthracenes, ploythiophenes and oligothiophenes.

In PPV the phenylene ring may optionally carry one or more substituents, e.g. each independently selected from alkyl, preferably methyl, alkoxy, preferably methoxy or ethoxy.

Any poly(arylenevinylene) including substituted derivatives thereof can be used and the phenylene ring in poly(p-phenylenevinylene) may be replaced by a fused ring system such as anthracene or naphthlyene ring and the number of vinylene groups in each polyphenylenevinylene moiety can be increased, e.g. up to 7 or higher.

The conjugated polymers can be made by the methods disclosed in U.S. Pat. No. 5,807,627, PCT/WO90/13148 and PCT/WO92/03490.

The thickness of the hole transporting layer is preferably 20 nm to 200 nm.

The polymers of an amino substituted aromatic compound such as polyanilines referred to above can also be used as buffer layers with or in conjunction with other hole transporting materials.

The structural formulae of some other hole transporting materials are shown in FIGS. 4, 5, 6, 7 and 8 of the drawings, where $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer, e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

Figure 2:
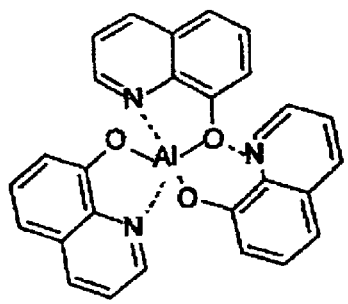
FIGS. 2 and 3 illustrate chemical formulae of certain types of electron injecting materials that may be used in some invention embodiments.
Figure 2:
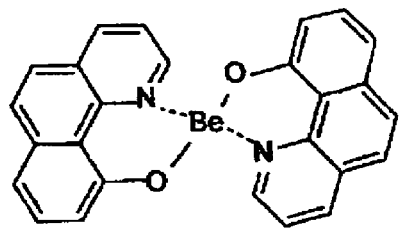
Figure 2:
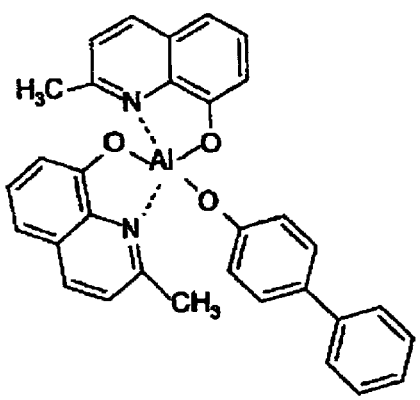
Figure 2:
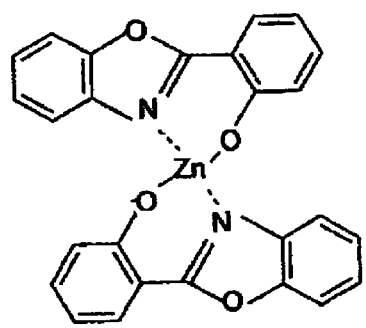
Figure 2:
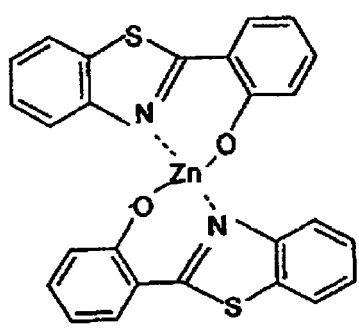
Figure 2:
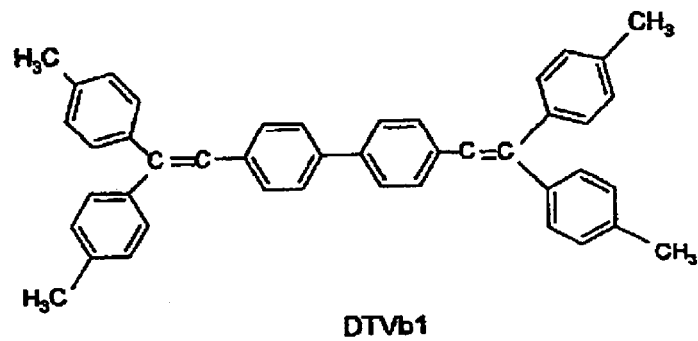
Figure 3:
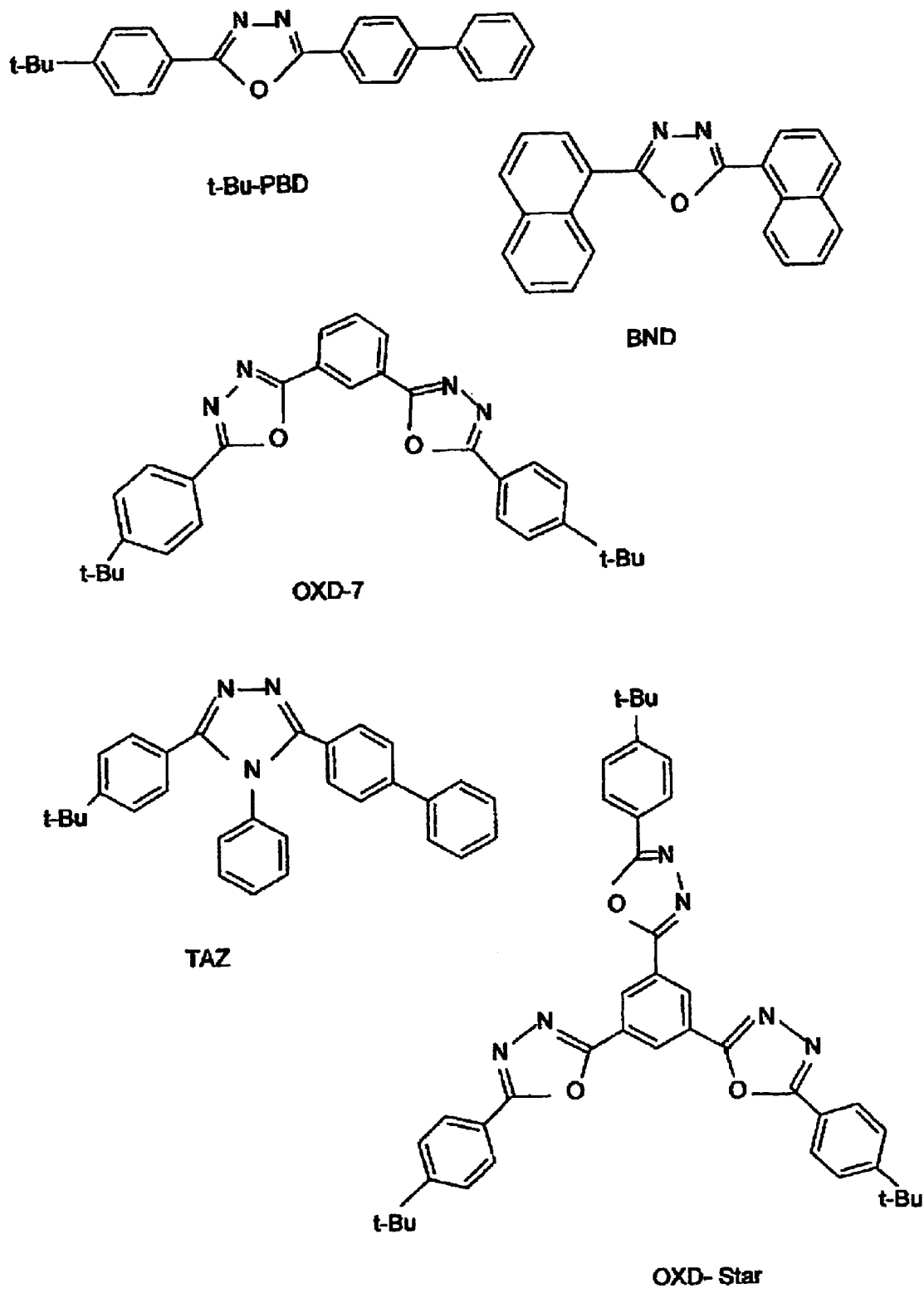
Figure 4:
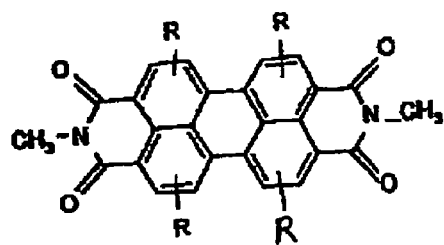
Figure 4:
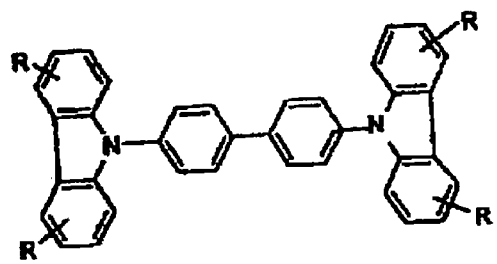
Figure 4:
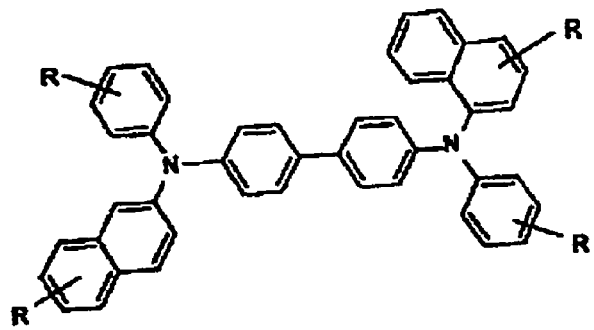
Figure 4:
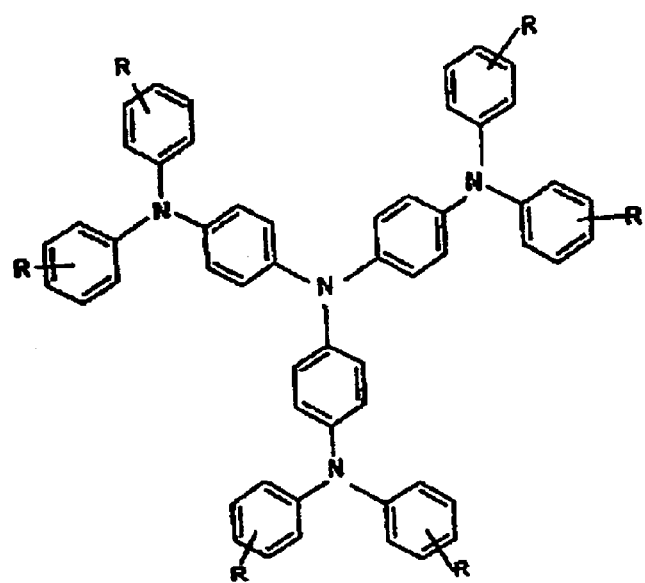
Figure 6:
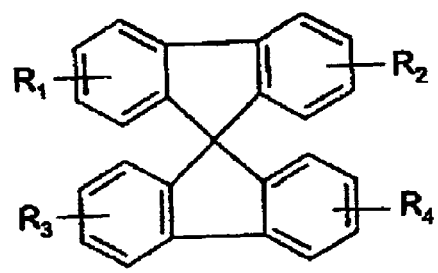
Figure 6:
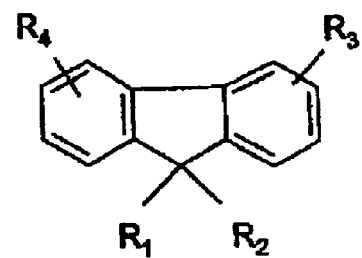
Figure 6:
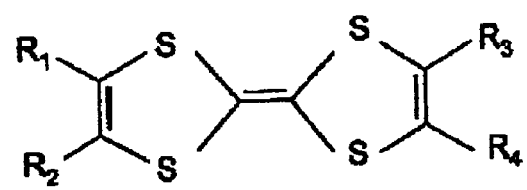
Figure 6:
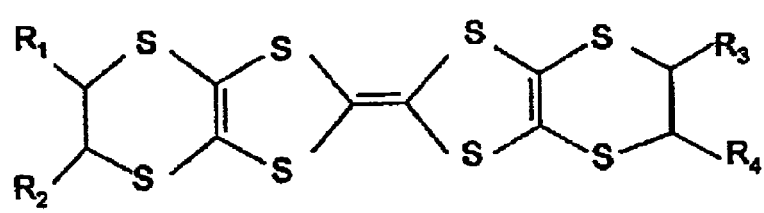
Figure 6:
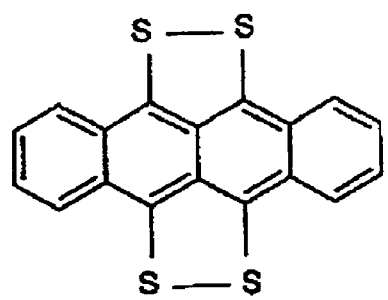
Figure 7:
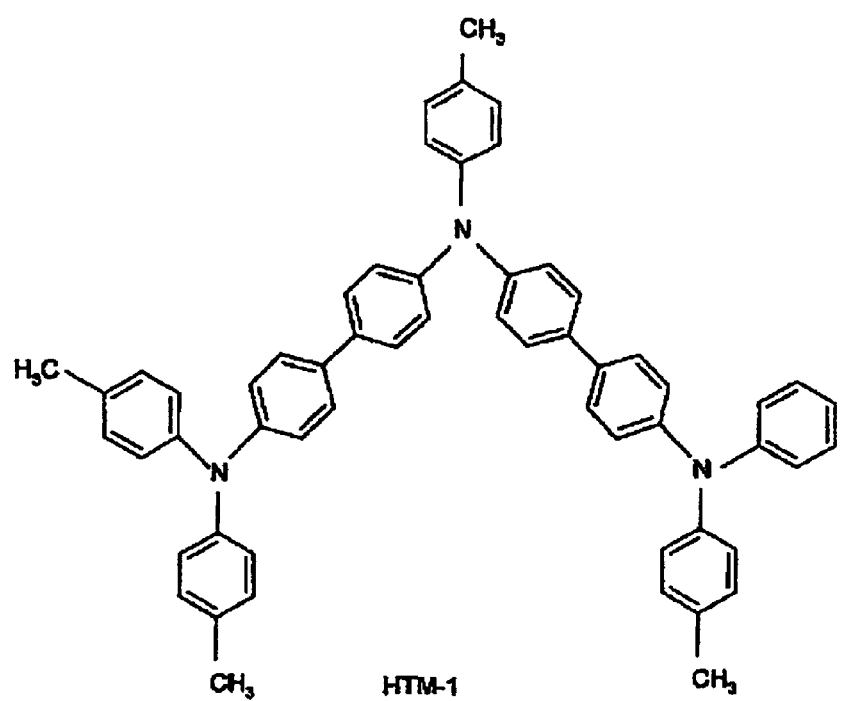
Figure 7:
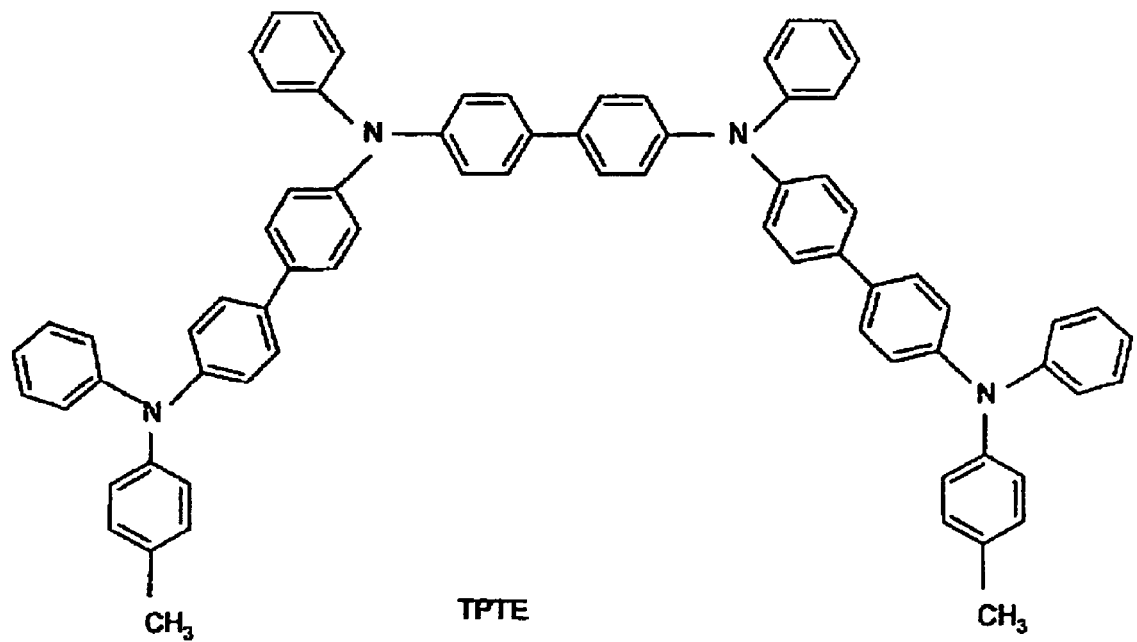
Figure 8:
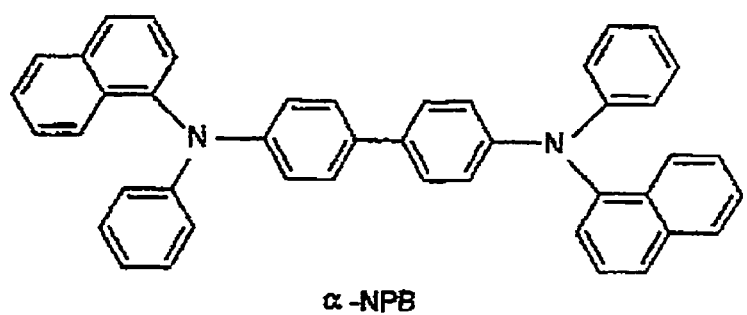
Figure 8:
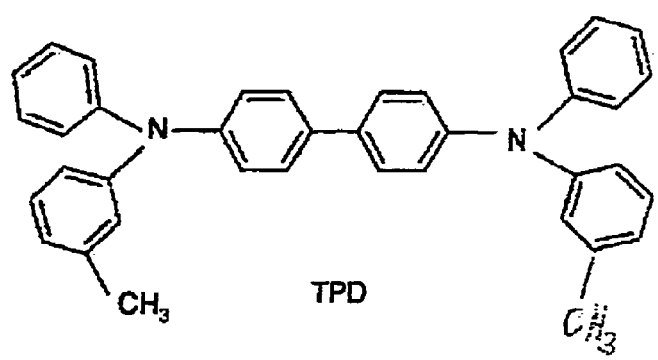
Figure 8:
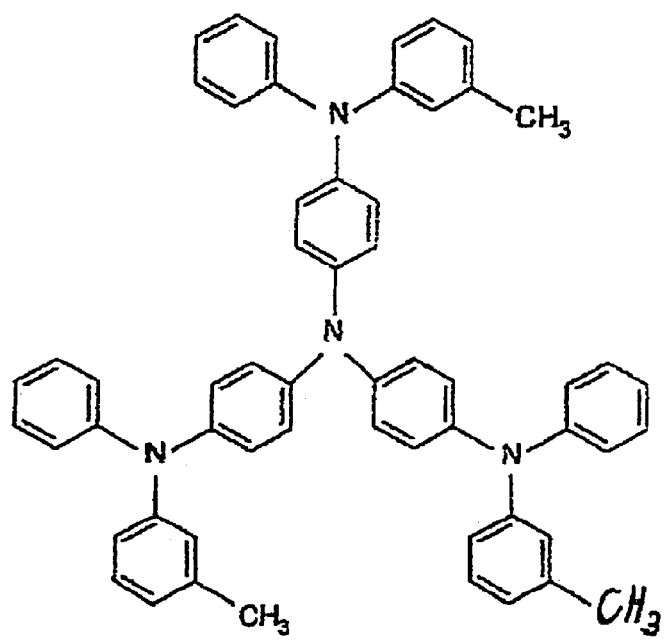

Optionally there is a layer of an electron injecting material between the anode and the electroluminescent material layer. The electron injecting material is a material which will transport electrons when an electric current is passed through electron injecting materials include a metal complex such as a metal quinolate, e.g. an aluminium quinolate, lithium quinolate, zirconium quinolate, a cyano anthracene such as 9,10 dicyano anthracene, cyano substituted aromatic compounds, tetracyanoquinidodimethane a polystyrene sulphonate or a compound with the structural formulae shown in FIG. 2 or 3 of the drawings in which the phenyl rings can be substituted with substituents R as defined above.

The first electrode is preferably a transparent substrate such as a conductive glass or plastic material which acts as the anode; preferred substrates are conductive glasses such as indium tin oxide coated glass, but any glass which is conductive or has a conductive layer such as a metal or conductive polymer can be used. Conductive polymers and conductive polymer coated glass or plastics materials can also be used as the substrate.

The cathode is preferably a low work function metal, e.g. aluminium, calcium, lithium, silver/magnesium alloys, rare earth metal alloys etc; aluminium is a preferred metal. A metal fluoride such as an alkali metal, rare earth metal or their alloys can be used as the second electrode, for example by having a metal fluoride layer formed on a metal.

The invention is illustrated in the Examples.

Summary of bis(phenylpyridine)(pyrazolone)iridium Complexes:

Compound A-D

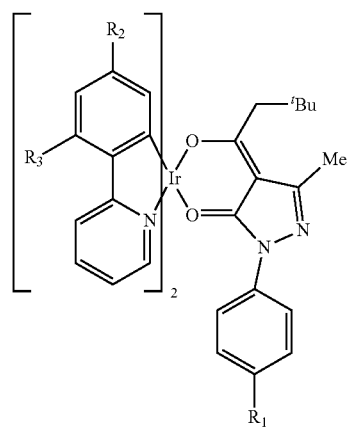

Compound E

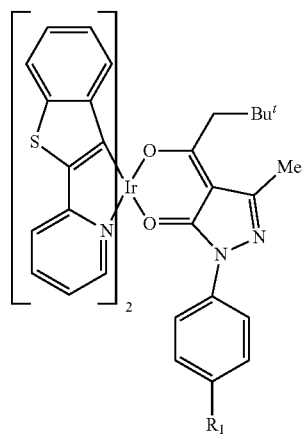

| Cpd | $R_1$ | $R_2$ | $R_3$ | m.p./°C. | $PL_{em}$ peak/ nm | Elemental analysis (CHN observed, found) | | |
|---|---|---|---|---|---|---|---|---|
| A | H | H | H | 271-275 (110 – $T_g$) | 526 (solid state) | 59.05 | 4.57 | 7.25 |
|   |   |   |   |   |   | 58.81 | 4.55 | 7.15 |
| B | H | F | H | 250 | 522 (solid state) | 56.49 | 4.12 | 6.93 |
|   |   |   |   |   | 493 (DCM) | 57.49 | 4.51 | 6.47 |
| C | H | F | F | 282-284 | 500 (solid state) | 54.81 | 3.70 | 6.64 |
|   |   |   |   |   | 483 (DCM) | 54.71 | 3.61 | 6.49 |
| D | F | F | F | 277-280 | 508 (solid state) | 52.96 | 3.51 | 6.50 |
|   |   |   |   |   | 484 (DCM) | 52.99 | 3.48 | 6.35 |
| E | H | Compound E | | Not observed | 615 (DCM) | 61.16 | 4.55 | 6.48 |
|   |   |   |   |   |   | 61.00 | 4.43 | 6.30 |

Tetrakis(2-phenylpyridine-C$^2$,N')(μ-chloro)diiridium
(Watts et al., J. Am. Chem. Soc., 1985, 107, 1431.)

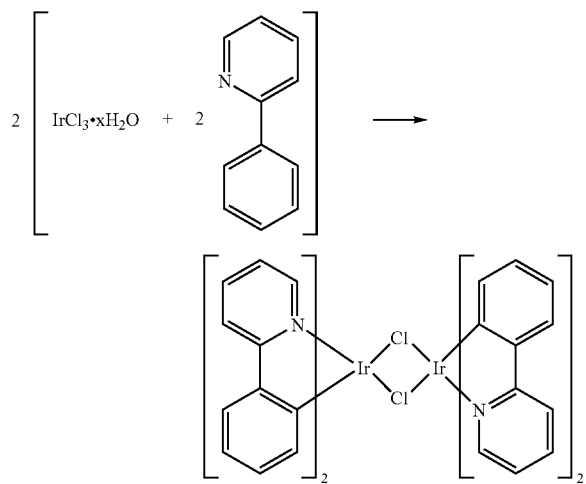

Iridium trichloride hydrate (0.39 g, 1.3 mmol) was combined with 2-phenylpyridine (0.76 g, 4.9 mmol), dissolved in a mixture of 2-ethoxyethanol (30 mL, dried and distilled over MgSO$_4$, degassed) and water (10 mL, degassed), and refluxed for 24 hours. The solution was cooled to room temperature and the yellow/green precipitate collected on a glass sinter. The precipitate was washed with ethanol (60 mL, 95%), acetone (60 mL), and then dissolved in dichloromethane (75 mL) and filtered. Toluene (25 mL) and hexane (10 mL) were added to the filtrate and the volume reduced in vacuo to about 50 mL. Cooling yielded crystals (yellow/green) of the desired product (0.43 g, 62%). This was used without further purification.

(A) Bis(2-phenylpyridine-C$^2$,N')(4-tert-butylacetyl-3-methyl-1-phenyl-pyrazol-5-onato)iridium

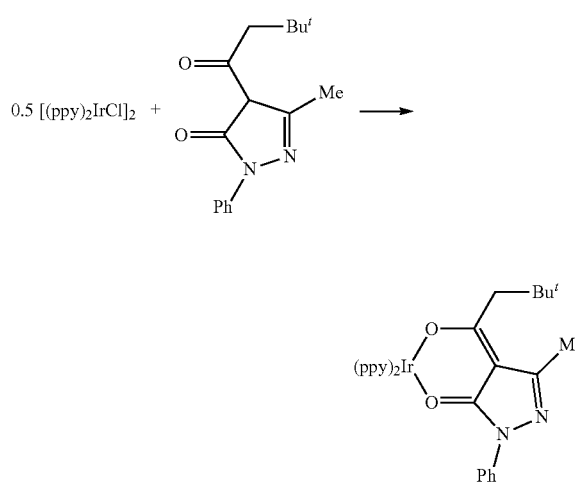

Tetrakis(2-phenylpyridine-C$^2$,N')(μ-chloro)diiridium (2.5 g, 2.35 mmol), 4-tert-butylacetyl-3-methyl-1-phenyl-pyrazol-5-one (2.72 g, 10 mmol) and sodium carbonate (dried at 100° C., 2.5 g, 23.6 mmol) were refluxed under an inert atmosphere (nitrogen) in 2-ethoxyethanol (dried and distilled over magnesium sulfate, 200 mL) for 16 hours. On cooling to room temperature, a yellow solution with a small amount of residue was observed. The solvent was reduced to approx. 5-10 mL under reduced pressure ($10^{-1}$ Torr) and elevated temperature (60° C.). Water (100 mL) was slowly added to the solution and the resulting yellow/orange precipitate (some darkly coloured impurities may also remain) filtered onto a glass frit (porosity 2 or 3). This was washed with further water and then petroleum spirit (40-60° C.). The crude product (after drying to remove water) was first purified by filtration through a short silica-gel pad and washing with dichloromethane (darkly coloured impurities remain on the silica-gel). Two products are identifiable by TLC. These can be separated on a flash silica-gel column using toluene (100 mL), then dichloromethane (200 mL) and finally dichloromethane:ethyl acetate (4:1, 200 mL) as eluents. Yield: 2.0 g (55%). The product may be further purified by sublimation (220° C., $2 \times 10^{-7}$ Torr). M.p. 271-5° C.

Tetrakis[2-(4-fluorophenyl)pyridine-C$^2$,N'](μ-chloro)diiridium

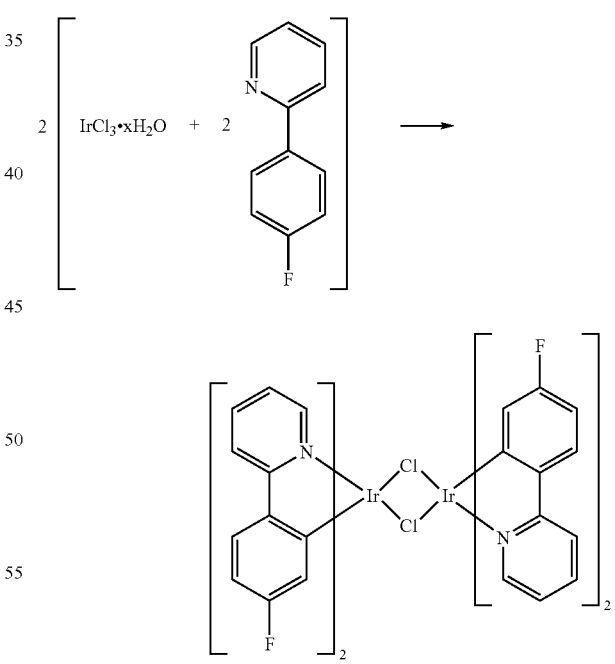

Iridium trichloride hydrate (1.64 g, 5.5 mmol) was combined with 2-(4-fluorophenyl)pyridine (2.84 g, 16.4 mmol), dissolved in a mixture of 2-ethoxyethanol (60 mL, dried and distilled over MgSO$_4$, degassed) and water (20 mL, degassed), and refluxed for 24 hours. The solution was cooled to room temperature and the yellow/green precipitate collected on a glass sinter. The precipitate was washed with ethanol (60 mL, 95%), acetone (60 mL), and hexane. This was dried and used without further purification. Yield (1.6 g, 51%)

(B) Bis[2-(4'-fluorophenyl)pyridine-C²,N'](4-tert-butylacetyl-3-methyl-1-phenyl-pyrazol-5-onato)iridium

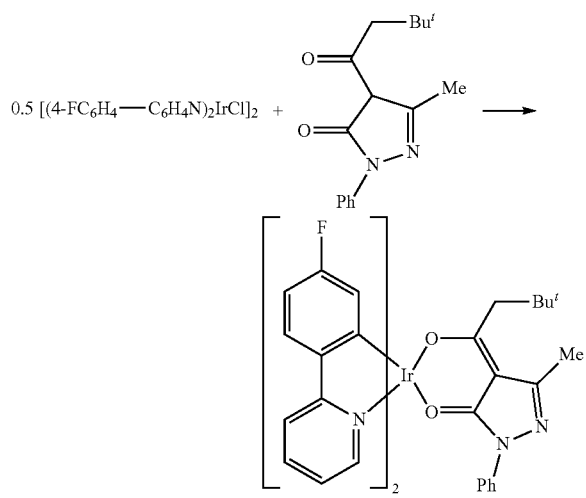

Tetrakis[2-(4'-fluorophenyl)pyridine-C²,N'](μ-chloro)diiridium (0.75 g, 0.66 mmol), 4-tert-butylcetyl-3-methyl-1-phenyl-pyrazol-5-one (0.7 g, 2.62 mmol) and sodium carbonate (dried at 100° C., 0.7 g, 6.6 mmol) were refluxed under an inert atmosphere in 2-ethoxyethanol (dried and distilled over magnesium sulfate, 40 mL) for 16 hours. On cooling to room temperature, a yellow solution with a small amount of residue was observed. The solution was filtered, washed with a little ethanol and the solvent was removed under reduced pressure ($10^{-1}$ Torr) and elevated temperature (60° C.). The crude product was dissolved in dichloromethane and initially purified by filtration through a short silica-gel pad and washing with dichloromethane (darkly coloured impurities remain on the silica-gel). Final purification is performed by flash column chromatography [dichloromethane:petroleum ether 60-80 (2:1 then 4:1)], discarding the first fraction and keeping the second, highly-luminescent fraction. M.p. 250° C.

Tetrakis[2-(2',4'-difluorophenyl)pyridine-C²,N'](μ-chloro)diiridium

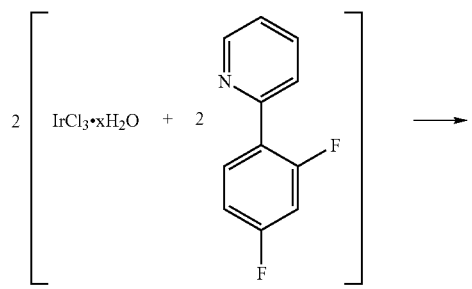

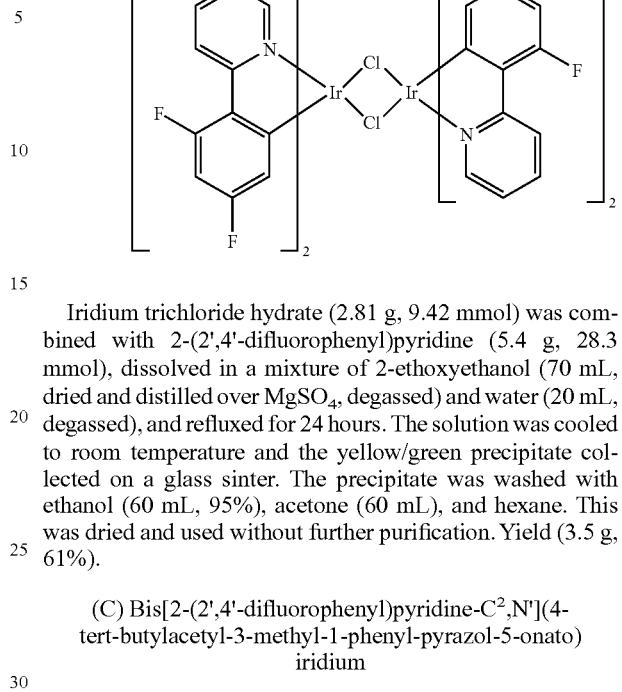

Iridium trichloride hydrate (2.81 g, 9.42 mmol) was combined with 2-(2',4'-difluorophenyl)pyridine (5.4 g, 28.3 mmol), dissolved in a mixture of 2-ethoxyethanol (70 mL, dried and distilled over MgSO₄, degassed) and water (20 mL, degassed), and refluxed for 24 hours. The solution was cooled to room temperature and the yellow/green precipitate collected on a glass sinter. The precipitate was washed with ethanol (60 mL, 95%), acetone (60 mL), and hexane. This was dried and used without further purification. Yield (3.5 g, 61%).

(C) Bis[2-(2',4'-difluorophenyl)pyridine-C²,N'](4-tert-butylacetyl-3-methyl-1-phenyl-pyrazol-5-onato)iridium

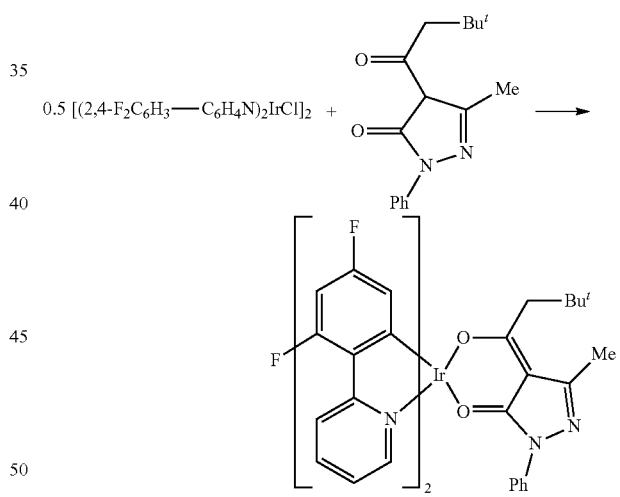

Tetrakis[2-(2',4'-difluorophenyl)pyridine-C²,N'](μ-chloro)diiridium (1.0 g, 0.82 mmol), 4-tert-butylcetyl-3-methyl-1-phenyl-pyrazol-5-one (0.571 g, 2.1 mmol) and sodium carbonate (dried at 100° C., 0.63 g, 5 mmol) were refluxed under an inert atmosphere in 2-ethoxyethanol (dried and distilled over magnesium sulfate, 40 mL) for 16 hours. On cooling to room temperature, a yellow solution with a small amount of residue was observed. The solution was filtered, washed with a little ethanol and the solvent was removed under reduced pressure ($10^{-1}$ Torr) and elevated temperature (60° C.). The crude product was dissolved in dichloromethane and initially purified by filtration through a short silica-gel pad and washing with dichloromethane (darkly coloured impurities remain on the silica-gel). Final purification was performed by flash column chromatography [chloroform:hexane (2:1, then 4:1)], discarding the first fraction and keeping the second, highly-luminescent fraction. Yield: 11.0 g (72%). M.p. 282° C.

(D) Bis[2-(2',4'-difluorophenyl)pyridine-$C^2$,N'][4-tert-butylacetyl-3-methyl-1-(4-fluorophenyl)-pyrazol-5-onato]iridium

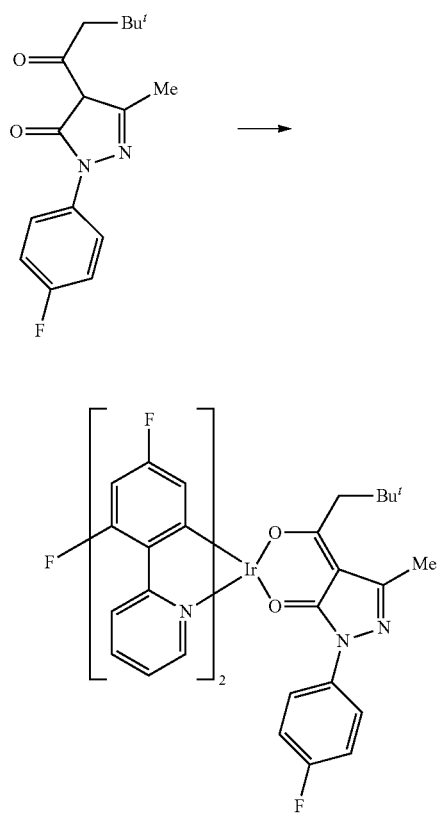

Tetrakis[2-(2',4'-difluorophenyl)pyridine-$C^2$,N'](μ-chloro)diiridium (1.0 g, 0.82 mmol), 4-tert-butylacetyl-3-methyl-1-(4'-fluorophenyl)-pyrazol-5-one (0.64 g, 2.2 mmol) and sodium carbonate (dried at 100° C., 0.63 g, 5 mmol) were refluxed under an inert atmosphere in 2-ethoxyethanol (dried and distilled over magnesium sulfate, 60 mL) for 16 hours. On cooling to room temperature, a yellow solution with a small amount of residue was observed. The solution was filtered, washed with a little ethanol and the solvent was removed under reduced pressure ($10^{-1}$ Torr) and elevated temperature (60° C.). The crude product was dissolved in dichloromethane and initially purified by filtration through a short silica-gel pad and washing with dichloromethane (darkly coloured impurities remain on the silica-gel). Final purification was performed by flash column chromatography [chloroform:hexane (2:1, then 4:1)], discarding the first fraction and keeping the second, highly-luminescent fraction. Yield: 1.0 g (72%). M.p. 277° C.

Tetrakis[2-benzo[b]thiophen-2-yl-pyridine-$C^2$,N'](μ-chloro)diiridium

Iridium trichloride hydrate (0.97 g, 3.24 mmol) was combined with 2-benzo[b]thiophen-2-yl-pyridine (2.05 g, 9.7 mmol), dissolved in a mixture of 2-ethoxyethanol (70 mL, dried and distilled over $MgSO_4$, degassed) and water (20 mL, degassed), and refluxed for 24 hours. The solution was cooled to room temperature and the yellow/green precipitate collected on a glass sinter. The precipitate was washed with ethanol (60 mL, 95%), acetone (60 mL), and hexane. This was dried and used without further purification. Yield (1.5 g, 71%)

(E) Bis[2-benzo[b]thiophen-2-yl-pyridine-$C^2$,N'](4-tert-butylacetyl-3-methyl-1-phenyl-pyrazol-5-onato)iridium

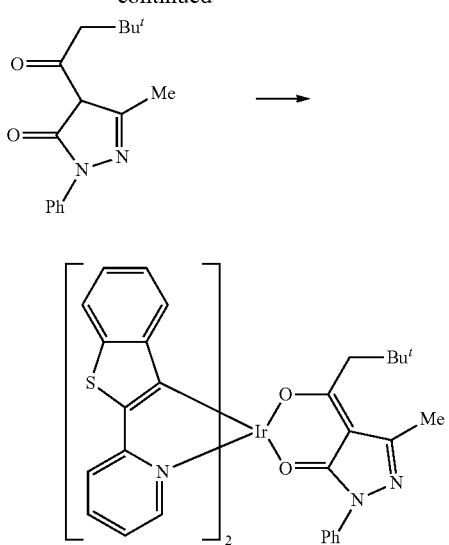

Tetrakis[2-benzo[b]thiophen-2-yl-pyridine-$C^2$,N'](μ-chloro)diiridium (1.0 g, 0.77 mmol), 4-tert-butylacetyl-3-methyl-1-phenyl-pyrazol-5-one (0.54 g, 2 mmol) and sodium carbonate (dried at 100° C., 0.63 g, 5 mmol) were refluxed under an inert atmosphere in 2-ethoxyethanol (dried and distilled over magnesium sulfate, 40 mL) for 16 hours. On cooling to room temperature, an orange/red solution with a small amount of residue was observed. The solution was filtered, washed with a little ethanol and the solvent was removed under reduced pressure ($10^{-1}$ Torr) and elevated temperature (60° C.). The crude product was dissolved in dichloromethane and initially purified by filtration through a short silica-gel pad and washing with dichloromethane (darkly coloured impurities remain on the silica-gel). Final purification was performed by flash column chromatography [chloroform:hexane (1:1, then 2:1)], discarding the first fraction and keeping the second, highly-luminescent fraction. Yield: 0.8 g (59%).

Summary of bis(phenylpyridine)(pyrazolyl-pyridine)iridium Complexes:

Compound F-H

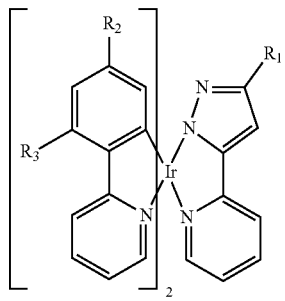

Compound I

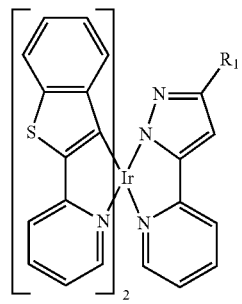

| Cpd | $R_1$ | $R_2$ | $R_3$ | m.p./° C. | $PL_{em}$ peak/ nm | Elemental analysis (CHN observed, found) | | |
|---|---|---|---|---|---|---|---|---|
| F | Ph | F | F | Not observed (194 – $T_g$) | 488, 498 (solid state) 470 (DCM) | 54.54 54.05 | 2.80 2.73 | 8.83 8.56 |
| G | CN—Ph | F | F | 374 (204 – $T_g$) | 502 (solid state) 468 (DCM) | 54.34 54.02 | 2.59 2.36 | 10.28 10.19 |
| H | tBu | F | F | 266 (166 – $T_g$) | 504 (solid state) 479 (DCM) | 52.84 | 3.39 | 9.06 |
| I | (OMe)$_3$—Ph | Compound I | Not onserved | | 597 (DCM) | 55.95 54.97 | 3.49 3.38 | 7.59 7.32 |

Tetrakis[2-(2,4-difluorophenyl)pyridine-C²,N'](μ-chloro)diiridium

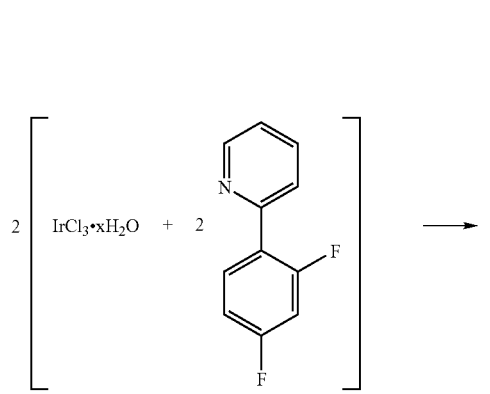

Iridium trichloride hydrate (2.81 g, 9.4 mmol) was combined with 2-(2',4'-difluorophenyl)pyridine (5.4 g, 28 mmol), dissolved in a mixture of 2-ethoxyethanol (70 mL, dried and distilled over MgSO₄, degassed) and water (20 mL, degassed), and refluxed for 24 hours. The solution was cooled to room temperature and the yellow precipitate collected on a glass sinter. The precipitate was washed with ethanol (60 mL, 95%), acetone (60 mL), and hexane. This was dried and used without further purification. Yield (3.5 g, 61%).

Bis[2-(2',4'-difluorophenyl)pyridine-C²,N'][2-(5-phenyl-2H-pyrazol-3-yl)pyridine]iridium 2 [(2,4-F₂C₆H₃C₆H₄N)₂IrCl]₂ +

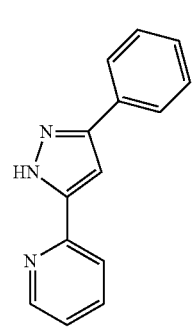

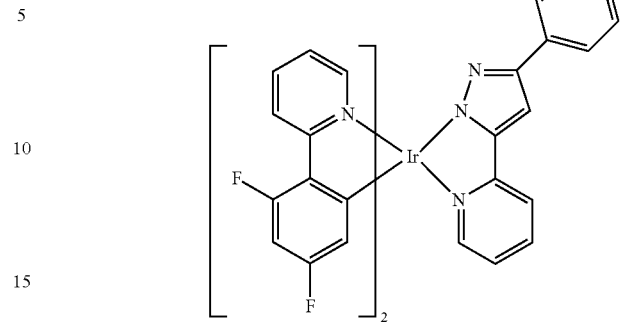

Potassium tert-butoxide (0.24 g, 2.1 mmol) and 2-(5-phenyl-2H-pyrazol-3-yl)pyridine (0.47 g, 2.1 mmol) were added to a 200 mL Schlenk tube under an inert atmosphere. 2-Ethoxyethanol (dried and distilled over magnesium sulfate, 40 mL) was added and the resultant solution stirred at ambient temperature for 10 minutes. Tetrakis[2-(2',4'-difluorophenyl)-C²,N'](μ-chloro)diiridium (1.0 g, 0.82 mmol) was added and the mixture refluxed under an inert atmosphere for 16 hours. On cooling to room temperature, a yellow solution with a small amount of residue was observed. The solvent was removed under reduced pressure (10⁻¹ Torr) and elevated temperature (60° C.). Purification was achieved on a flash silica-gel column (chloroform, then chloroform:ethyl acetate 4:1). Yield: 0.9 g (69%).

$T_g$ 194° C.

Bis[2-(2',4'-difluorophenyl)pyridine-C²,N']{2-[5-(4-benzonitrile)-2H-pyrazol-3-yl]pyridine}iridium 2 [(2,4-F₂C₆H₃C₆H₄N)₂IrCl]₂ +

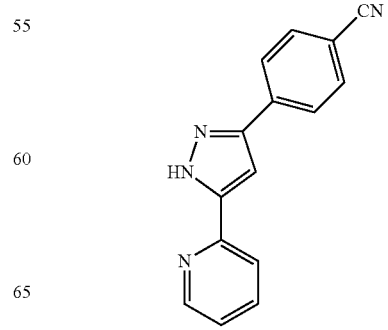

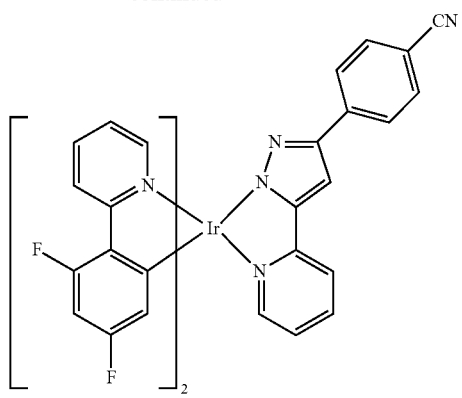

Potassium tert-butoxide (0.24 g, 2.1 mmol) and 2-[5-(4'-cyanophenyl)-2H-pyrazol-3-yl]pyridine (0.52 g, 2.1 mmol) were added to a 200 mL Schlenk tube under an inert atmosphere. 2-Ethoxyethanol (dried and distilled over magnesium sulfate, 40 mL) was added and the resultant solution stirred at ambient temperature for 10 minutes. Tetrakis[2-(2',4'-difluorophenyl)-$C^2$,N'](μ-chloro)diiridium (1.0 g, 0.82 mmol) was added and the mixture refluxed under an inert atmosphere for 16 hours. On cooling to room temperature, a yellow solution with a small amount of residue was observed. The solvent was removed under reduced pressure ($10^{-1}$ Torr) and elevated temperature (60° C.). Purification was achieved on a flash silica-gel column (chloroform, then chloroform:ethyl acetate 4:1), followed by recrystallisation from methanol. Yield: 1.0 g (75%). M.p. 367° C. $T_g$ 208° C.

Bis[2-benzo[b]thiophen-2-yl-pyridine-$C^2$,N']{2-[5-(3',4',5'-trimethoxyphenyl)-2H-pyrazol-3-yl]pyridine}iridium

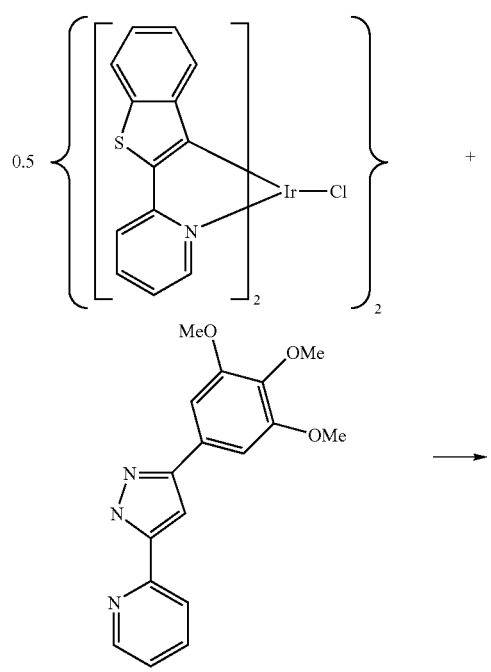

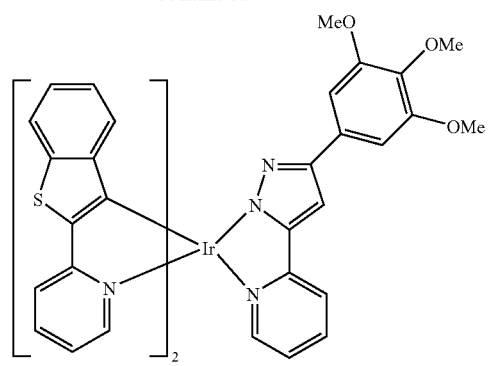

Potassium tert-butoxide (0.09 g, 0.8 mmol) and 2-[5-(3',4',5'-trimethoxyphenyl)-2H-pyrazol-3-yl]pyridine (0.25 g, 0.8 mmol) were added to a 200 mL Schlenk tube under an inert atmosphere. 2-Ethoxyethanol (dried and distilled over magnesium sulfate, 30 mL) was added and the resultant solution stirred at ambient temperature for 10 minutes. Tetrakis[2-benzo[b]thiophen-2-yl-pyridine-$C^2$,N'](μ-chloro)diiridium (0.5 g, 0.385 mmol) was added and the mixture refluxed under an inert atmosphere for 16 hours. On cooling to room temperature, an orange/red solution with a small amount of residue was observed. The solvent was removed under reduced pressure ($10^{-1}$ Torr) and elevated temperature (60° C.). Purification was achieved on a flash silica-gel column (chloroform), followed by recrystallisation from ethanol. Yield: 0.6 g (84%).

Electroluminescent Devices

In these devices the following compounds were used:—

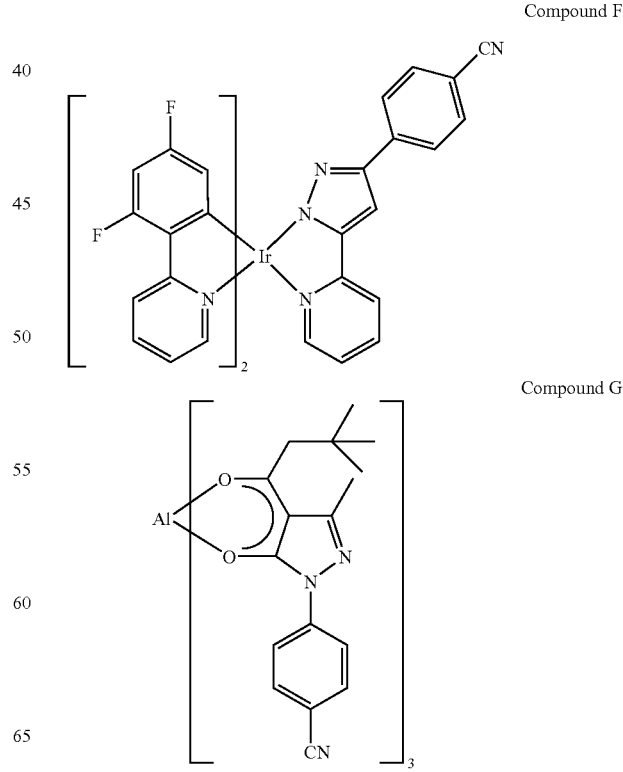

Compound K

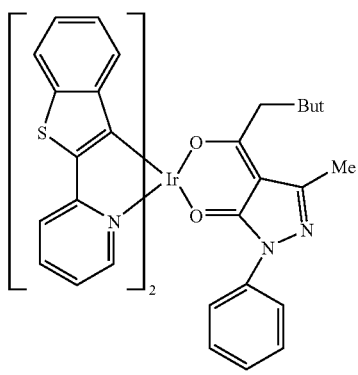

Compound L

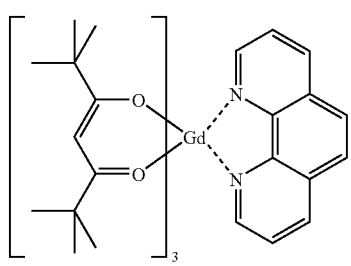

Compound H

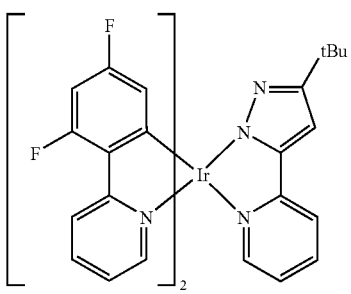

Compound J

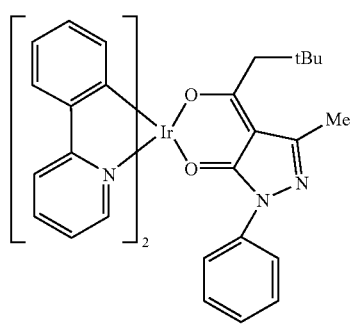

Example 1

A pre-etched ITO coated glass piece (10×10 cm$^2$) was used. The device was fabricated by sequentially forming on the ITO, by vacuum evaporation using a Solciet Machine, ULVAC Ltd. Chigacki, Japan the active area of each pixel was 3 mm by 3 mm, the layers comprised:—

(1) ITO (165 nm)/(2) CuPc (25 nm)/(3) α-NPB (40 nm)/(4) TCTA:Compound F (38:2.1 nm)/(5) Liq (30 nm)/(6) LiF (0.5 nm)/(7) Al The device structure is shown in FIG. 1 where CuPc is a copper phthalocyanine buffer layer, α-NPB is as in fig. TCTA is 4,4',4"-Tris(carbazole-9-yl)-triphenylamine, Liq is lithium quinolate and LiF is lithium fluoride.

The coated electrodes were stored in a vacuum desiccator over a molecular sieve and phosphorous pentoxide until they were loaded into a vacuum coater (Edwards, 10$^{-6}$ torr) and aluminium top contacts made. The devices were then kept in a vacuum desiccator until the electroluminescence studies were performed.

The ITO electrode was always connected to the positive terminal. The current vs. voltage studies were carried out on a computer controlled Keithly 2400 source meter.

The electroluminescent properties of this device were measured.

Example 2

An electroluminescent device was made as in Example 1 with the structure:

ITO (165 nm)/CuPc (25 nm)/α-NPB (40 nm)/TCTA:Compound F (37:3 nm)/Compound G (3 nm)/Zrq$_4$ (30 nm)/LiF (0.5 nm)/Al where Zrq$_4$ is zirconium quinolate.

The electroluminescent properties of this device were measured.

Example 3

An electroluminescent device was made as in Example 1 with the structure

ITO (165 nm)/CuPc (25 nm)/α-NPB (60 nm)/CBP:Compound J (20:1.3 nm)/BCP (6 nm)/Alq$_3$ (40 nm)/LiF (0.2 nm)/Al where CBP is as in FIG. 5b of the accompanying drawings where R is hydrogen.

and BCP is bathocupron.

The electroluminescent properties of this device were measured.

Example 4

An electroluminescent device was made as in Example 1 with the structure

ITO (165 nm)/CuPc (25 nm)/α-NPB (40 nm)/CBP:Compound J (20:0.6 nm)/BCP (6 nm)/Liq (40 nm)/LiF (0.5 nm)/Al.

The electroluminescent properties of this device were measured.

Example 5

An electroluminescent device was made as in Example 1 with the structure:

ITO (165 nm)/α-NPB (40 nm)/CBP:Compound J (20:7 nm)/BCP (10 nm)/Zrq$_4$ (50 nm)/LiF (0.5 nm)/Al.

The electroluminescent properties of this device were measured.

Example 6

An electroluminescent device was made as in Example 1 with the structure:

ITO (165 nm)/CuPc (25 nm)/α-NPB (40 nm)/TCTA:Compound H (40:0.8 nm)/Liq (30 nm)/LiF (0.5 nm)/Al.

The electroluminescent properties of this device were measured.

Example 7

An electroluminescent device was made as in Example 1 with the structure:

ITO (165 nm)/α-NPB (40 nm)/CBP:Compound J (20:8.3 nm)/Compound L (10 nm)/Zrq$_4$ (50 nm)/LiF (0.5 nm)/Al.

The electroluminescent properties of this device were measured.

Example 8

An electroluminescent device was made as in Example 1 with the structure;

ITO (165 nm)/CuPc (25 nm)/α-NPB (40 nm)/CBP:Compound K (35:5 nm/Zrq$_4$ (30 nm)/LiF (0.5 nm)/Al.

Figure 9A:
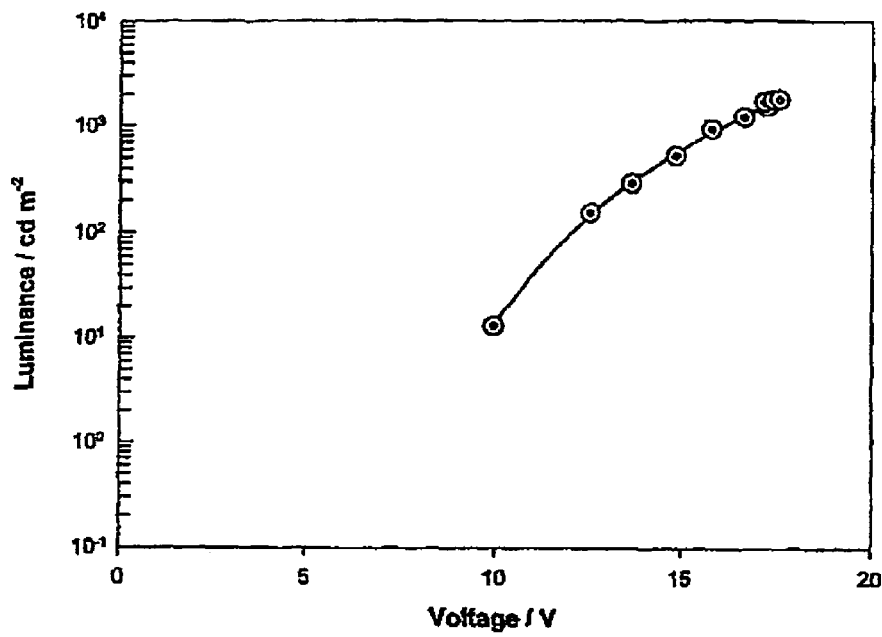
FIGS. 9*a*, 9*b* and 9*c* illustrate the electroluminescent properties of an electroluminescent device according to the present invention fabricated in accordance with Example 8.
Figure 9B:
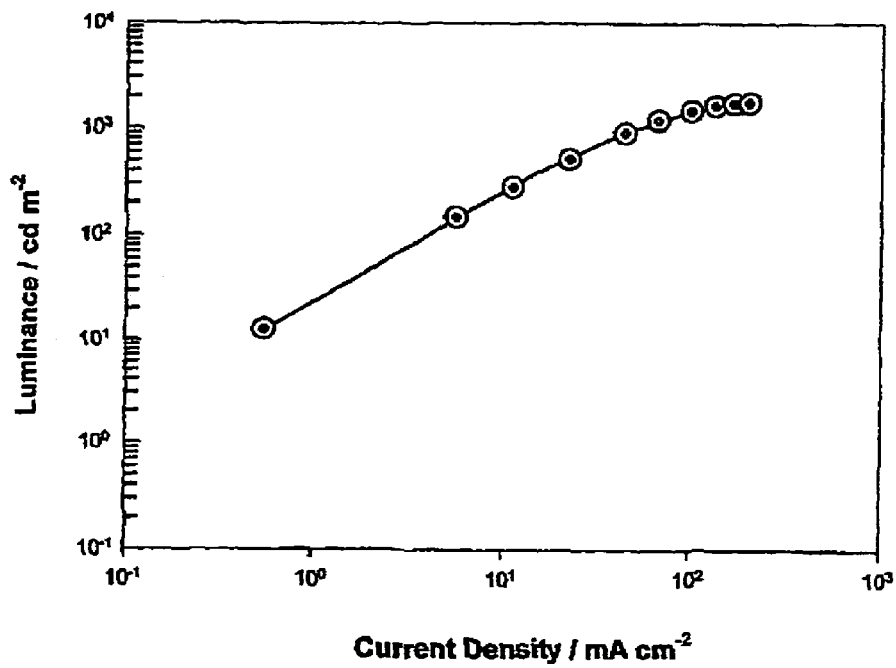
Figure 9C:
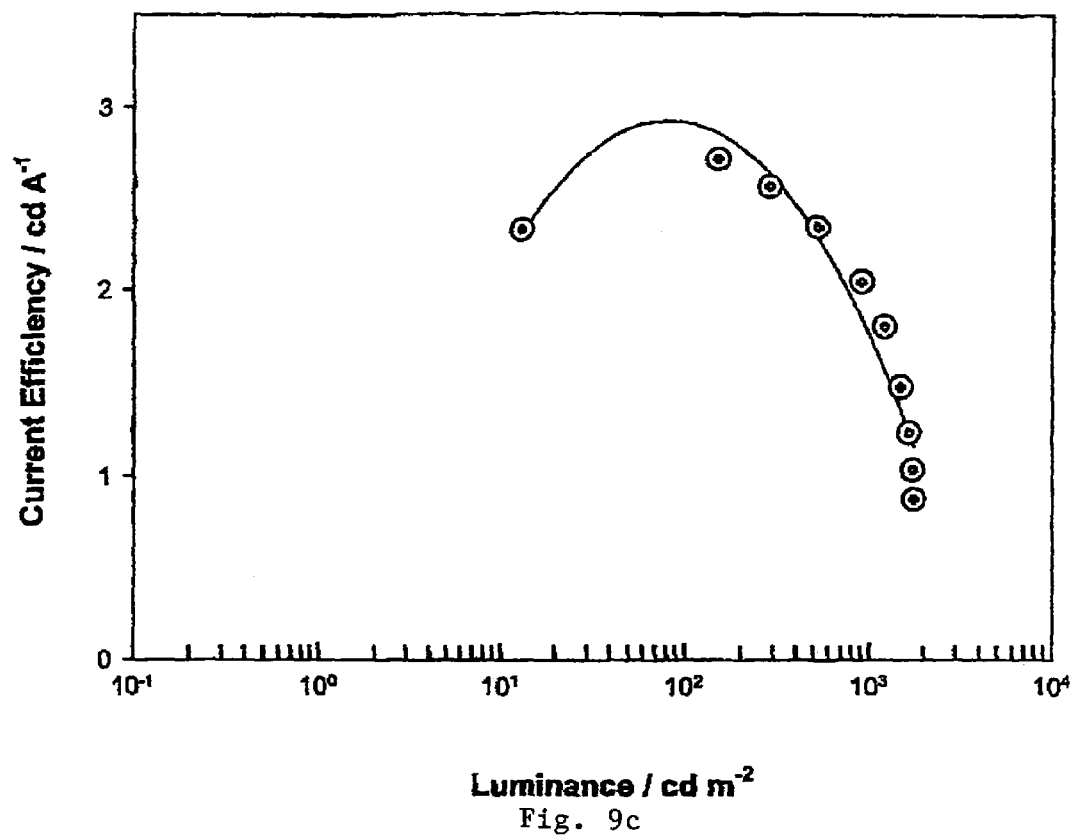

The electroluminescent properties of this device were measured and the results are shown in FIGS. 9a, 9b and 9c. The electroluminescent device on which FIGS. 9a, 9b and 9c are based demonstrated CIE coordinates of x=0.67 and y=0.32 and produced a peak luminescent wave length of about 600 nm.

Example 9

An electroluminescent device was made as in Example 1 with the structure:

ITO (165 nm)/CuPc (50 nm)/α-NPB (40 nm)/CBP:Compound J (20:6.1 nm)/Compound F (10 nm)/Zrq$_4$ (50 nm)/LiF (0.5 nm)/Al.

The electroluminescent properties of this device were measured.

The invention claimed is:

1. An electroluminescent compound having the following general chemical formula:

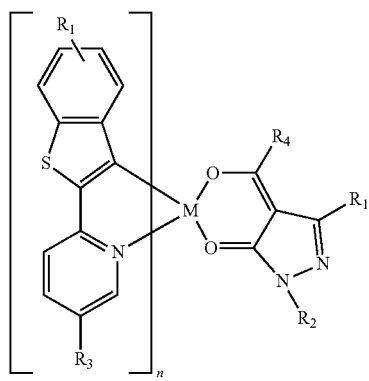

wherein $R_1$, $R_2$, $R_3$ and $R_4$ can be the same or different and are independently selected from the group consisting of hydrogen; substituted and unsubstituted hydrocarbyl groups; substituted and unsubstituted aliphatic groups; substituted and unsubstituted aromatic, heterocyclic and polycyclic ring structures; aryloxy groups; fluorocarbon groups; halogens; and thiophenyl groups; further wherein $R_1$, $R_2$ and $R_3$ can also form substituted and unsubstituted fused aromatic, heterocyclic and polycyclic ring structures and can be copolymerisable with a monomer; M is selected from the group consisting of ruthenium, rhodium, palladium, osmium, iridium and platinum; and the sum (n+1) is equal to the valency of M.

2. An electroluminescent compound as claimed in claim 1 wherein at least one of $R_1$, $R_2$, $R_3$ and $R_4$ includes a group selected from alkoxy groups, aryloxy groups, carboxy groups, substituted and unsubstituted phenyl groups, fluorophenyl groups, biphenyl groups, phenanthrene groups, anthracene groups, naphthyl groups, fluorene groups, and heterocyclic groups.

3. An electroluminescent compound as claimed in claim 1, wherein M is iridium and n is 2.

4. An electroluminescent compound as claimed in claim 1 wherein at least one of $R_1$, $R_2$, $R_3$ and $R_4$ includes a group selected from aliphatic groups and aromatic groups.

5. An electroluminescent compound as claimed in claim 1 wherein $R_2$ is a phenyl group or a substituted phenyl group.

6. An electroluminescent device comprising: (i) a first electrode; (ii) a second electrode; and, (iii) a layer of an electroluminescent material according to claim 1 positioned between said first and second electrodes.

7. An electroluminescent device according to claim 6 further comprising a layer of a hole transmitting material positioned between the first electrode and the layer of electroluminescent material.

8. An electroluminescent device according to claim 7 wherein the hole transmitting material is a polyaromatic amine.

9. An electroluminescent device according to claim 7 wherein the hole transmitting material is a copolymer of aniline.

10. An electroluminescent device according to claim 7 wherein the hole transmitting material is a conjugated polymer.

11. An electroluminescent device according to claim 7 wherein the hole transmitting material is a conjugated polymer selected from the group consisting of poly (p-phenylenevinylene) (PPV) and copolymers of PPV.

12. An electroluminescent device according to claim 6 wherein the electroluminescent material is mixed with a hole transmitting material.

13. An electroluminescent device according to claim 6 wherein a layer of an electron transmitting material is positioned between an electrode that serves as a cathode element and the layer of electroluminescent material.

14. An electroluminescent device according to claim 13 wherein the electron transmitting material is a metal quinolate.

15. An electroluminescent device according to claim 13 wherein the electron transmitting material is a metal quinolate selected from the group consisting of aluminum quinolate, zirconium quinolate and lithium quinolate.

16. An electroluminescent device according to claim 13 wherein the electron transmitting material is selected from the group consisting of:

(a) a material having the general chemical formula Mx(DBM)$_n$ where Mx is a metal, DBM is dibenzoyl methane, and n is the valency of Mx;

(b) a cyano anthracene (c) a polystyrene sulphonate; and, (d) a compound having a general chemical formula selected from the group consisting of:

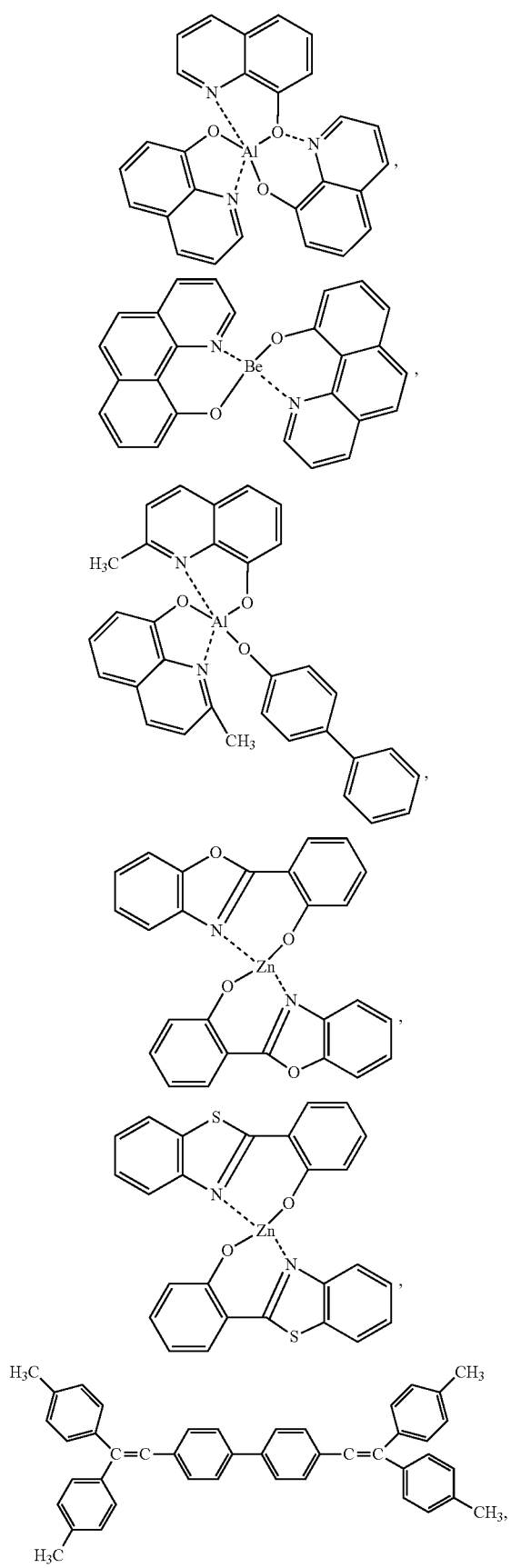

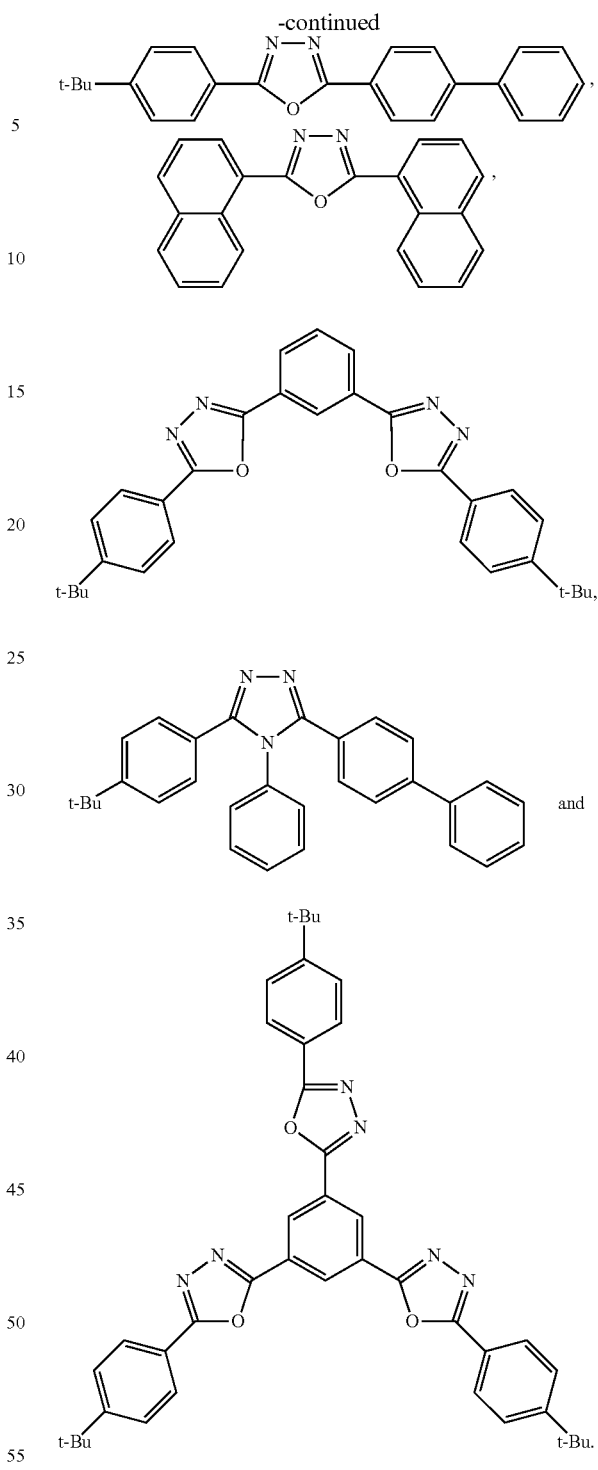

17. An electroluminescent device according to claim 6 wherein an electron transmitting material is mixed with the electroluminescent material.

18. An electroluminescent device according to claim 6 wherein the first electrode comprises a transparent, electricity-conducting glass electrode.

19. An electroluminescent device according to claim 6 wherein the second electrode comprises a material selected from the group consisting of aluminum, calcium, lithium, magnesium, alloys thereof, and silver/magnesium alloys.

20. A method of preparing an electroluminescent compound having the general chemical formula

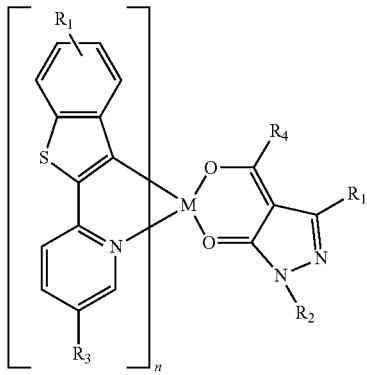

wherein $R_1$, $R_2$, $R_3$ and $R_4$ can be the same or different and are independently selected from the group consisting of hydrogen; substituted and unsubstituted hydrocarbyl groups; substituted and unsubstituted aliphatic groups; substituted and unsubstituted aromatic, heterocyclic and polycyclic ring structures; aryloxy groups; fluorocarbon groups; halogens; and thiophenyl groups; further wherein $R_1$, $R_2$ and $R_3$ can also form substituted and unsubstituted fused aromatic, heterocyclic and polycyclic ring structures and can be copolymerisable with a monomer, said method comprising the step of reacting a compound having the general chemical formula

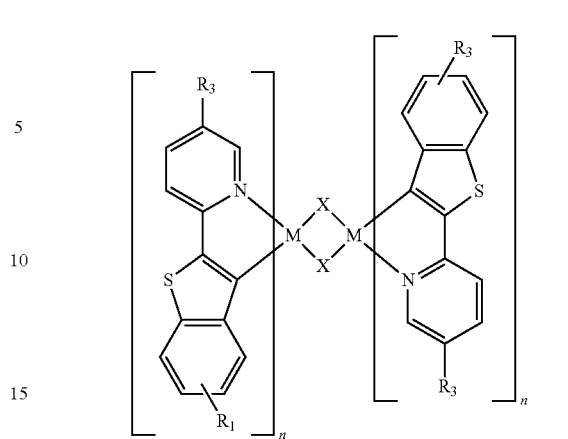

with a compound having the general chemical formula

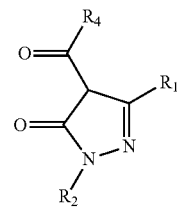

where $R_1$, $R_2$, $R_3$ and $R_4$ are defined as above; X is an anion; M is selected from the group consisting of ruthenium, rhodium, palladium, osmium, iridium and platinum; and the sum (n+1) is equal to the valency of M.

* * * * *